United States Patent
Park et al.

(10) Patent No.: US 11,249,396 B2
(45) Date of Patent: Feb. 15, 2022

(54) RESIST UNDERLAYER COMPOSITION, AND METHOD OF FORMING PATTERNS USING THE COMPOSITION

(71) Applicant: Samsung SDI Co., Ltd., Yongin-si (KR)

(72) Inventors: Hyeon Park, Suwon-si (KR); Yoojeong Choi, Suwon-si (KR); Soonhyung Kwon, Suwon-si (KR); Shinhyo Bae, Suwon-si (KR); Jaeyeol Baek, Suwon-si (KR)

(73) Assignee: Samsung SDI Co., Ltd., Yongin-si (KR)

( * ) Notice: Subject to any disclaimer, the term of this patent is extended or adjusted under 35 U.S.C. 154(b) by 159 days.

(21) Appl. No.: 16/789,233

(22) Filed: Feb. 12, 2020

(65) Prior Publication Data
US 2020/0285153 A1  Sep. 10, 2020

(30) Foreign Application Priority Data
Mar. 6, 2019 (KR) .......... 10-2019-0025943

(51) Int. Cl.
| | |
|---|---|
| *G03F 7/11* | (2006.01) |
| *G03F 7/004* | (2006.01) |
| *C08G 73/06* | (2006.01) |
| *C08G 18/79* | (2006.01) |
| *G03F 7/16* | (2006.01) |

(52) U.S. Cl.
CPC .............. *G03F 7/11* (2013.01); *C08G 18/791* (2013.01); *C08G 73/0655* (2013.01); *G03F 7/0045* (2013.01); *G03F 7/168* (2013.01)

(58) Field of Classification Search
CPC .......... G03F 7/11; G03F 7/091; G03F 7/0007; G03F 7/0275; G03F 7/0045; G03F 7/168; G03F 7/20; G03F 7/0757; G03F 7/0382; C08L 79/04; C09D 167/00; C09D 183/14; C09D 183/06; C09D 179/04; C08G 73/0677; C08G 73/0644; C08G 73/0638; C08G 73/0273; C08G 73/06; C08G 63/6854; C08G 18/791; C08G 73/0655; C08G 77/26; C08G 77/50; C08G 77/14; C08G 77/52; C08G 77/24; C08G 77/54

See application file for complete search history.

(56) References Cited

U.S. PATENT DOCUMENTS

| | | | |
|---|---|---|---|
| 2004/0110096 A1 | 6/2004 | Kishioka et al. | |
| 2010/0009297 A1* | 1/2010 | Yao | ............... C08G 73/0644 430/325 |
| 2010/0047713 A1* | 2/2010 | Murofushi | ............ G03F 7/0275 430/281.1 |
| 2013/0196114 A1* | 8/2013 | Urano | ................ C09D 183/14 428/139 |
| 2017/0199459 A1 | 7/2017 | Ryu et al. | |

FOREIGN PATENT DOCUMENTS

| | | |
|---|---|---|
| JP | 4247643 B2 | 4/2009 |
| JP | 2011-527461 A | 10/2011 |
| JP | 5679129 B2 | 3/2015 |
| JP | 2015-145944 A | 8/2015 |
| JP | WO2014/014034 A1 | 7/2016 |
| JP | 2016-222761 A | 12/2016 |

(Continued)

OTHER PUBLICATIONS

JPO Office Action issued in JP Patent Application No. 2020-023469 dated Jan. 12, 2021, 3 pages.

(Continued)

*Primary Examiner* — John A McPherson
*Assistant Examiner* — Richard David Champion
(74) *Attorney, Agent, or Firm* — Lewis Roca Rothgerber Christie LLP

(57) ABSTRACT

A resist underlayer composition includes a polymer including a structural unit represented by Chemical Formula 1; and a solvent and a method of forming patterns using the resist underlayer composition:

[Chemical Formula 1]

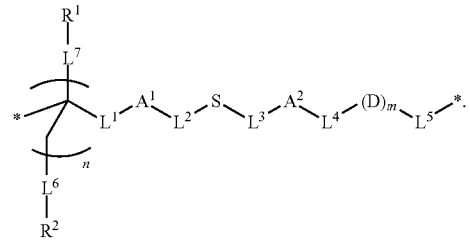

In Chemical Formula 1, at least one of $A^1$ and $A^2$ is a group represented by Chemical Formula A:

[Chemical Formula A]

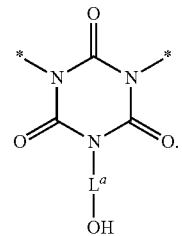

19 Claims, No Drawings

(56) References Cited

FOREIGN PATENT DOCUMENTS

| | | |
|---|---|---|
| JP | 2018-124546 A | 8/2018 |
| KR | 10-2011-0095362 A | 8/2011 |
| KR | 10-2014-0006794 A | 1/2014 |
| KR | 10-2014-0050046 A | 4/2014 |
| KR | 10-1530197 B1 | 6/2015 |
| KR | 10-2016-0014724 A | 2/2016 |
| KR | 10-2016-0060035 A | 5/2016 |
| KR | 10-2016-0102175 A | 8/2016 |
| KR | 10-2016-0112847 A | 9/2016 |
| KR | 10-2016-0138397 A | 12/2016 |
| KR | 10-2016-0146691 A | 12/2016 |
| KR | 10-2017-0014120 A | 2/2017 |
| KR | 10-2017-0084820 A | 7/2017 |
| KR | 10-1764259 B1 | 8/2017 |
| KR | 10-1771543 B1 | 8/2017 |
| KR | 10-2018-0090640 A | 8/2018 |
| KR | 10-2018-0121205 A | 11/2018 |
| TW | 201346451 A | 11/2013 |
| TW | 201518867 A | 5/2015 |
| TW | 201704279 A | 2/2017 |
| WO | WO 2015/163195 A1 | 10/2015 |

OTHER PUBLICATIONS

TPO Office Action issued in TW Patent Application No. 109105331 dated Jan. 19, 2021, 4 pages.
JPO Notice of Allowance dated Sep. 21, 2021, issued in corresponding Japanese Patent Application No. 2020-023469, 3 pages.
KIPO Notice of Allowance dated Nov. 1, 2021, issued in corresponding Korean Patent Application No. 10-2019-0025943, 2 pages.

* cited by examiner

RESIST UNDERLAYER COMPOSITION, AND METHOD OF FORMING PATTERNS USING THE COMPOSITION

CROSS-REFERENCE TO RELATED APPLICATION

This application claims priority to and the benefit of Korean Patent Application No. 10-2019-0025943 filed in the Korean Intellectual Property Office on Mar. 6, 2019, the entire content of which is incorporated herein by reference.

BACKGROUND

1. Field

One or more aspects of embodiments of the present disclosure relate to a resist underlayer composition and a method of forming patterns using the same. For example, embodiments of the present disclosure relate to a photoresist underlayer composition formed between a semiconductor substrate and a photoresist layer, and a method of forming a photoresist pattern using the same.

2. Description of the Related Art

The semiconductor industry has recently developed to an ultra-fine technology level using device patterns on a scale of several to several tens of nanometers. Effective lithographic techniques are desired for ultrafine technology.

A lithographic technique may include coating a photoresist layer on a semiconductor substrate such as a silicon wafer, exposing and developing it (e.g., the photoresist layer) to form a thin layer, disposing a mask pattern having a desired device pattern and irradiating with activated radiation (such as ultraviolet (UV) radiation), developing the resultant to obtain a photoresist pattern, and etching the substrate using the photoresist pattern as a protective layer to form a fine pattern corresponding to the pattern on the surface of the substrate.

As technology to manufacture an ultra-fine pattern is desired, activated radiation having a short wavelength (such as an i-line (wavelength of 365 nm), a KrF excimer laser (wavelength of 248 nm), an ArF excimer laser (wavelength of 193 nm), and/or the like have been used for exposure of a photoresist. As diffuse reflection from a semiconductor substrate, a standing wave, and/or the like may be a problem during exposure with short-wavelength radiation, research has been made on interposing a resist underlayer having optimal or suitable reflectance between the photoresist and the semiconductor substrate.

High energy rays such as EUV (extreme ultraviolet; having a wavelength of 13.5 nm), an e-beam (electron beam), and/or the like have also been used as light sources for manufacturing the fine pattern, and do not reflect against the substrate, but research on improving adherence of the resist to the lower layer is desired to reduce collapse of the photoresist pattern. In addition, research on improving the etch selectivity and chemical resistance of the resist underlayer, in addition to decreasing problems associated the light source, is desired.

SUMMARY

One or more aspects of embodiments of the present disclosure are directed toward a resist underlayer composition having optimized or suitable reflectance for a set or predetermined wavelength, while concurrently (e.g., simultaneously) having improved coating properties, adherence with photoresist, and/or fast etch rate.

One or more aspects of embodiments of the present disclosure are directed toward a method of forming patterns using the resist underlayer composition.

One or more example embodiments of the present disclosure provide a resist underlayer composition including a polymer including a structural unit represented by Chemical Formula 1; and a solvent:

[Chemical Formula 1]

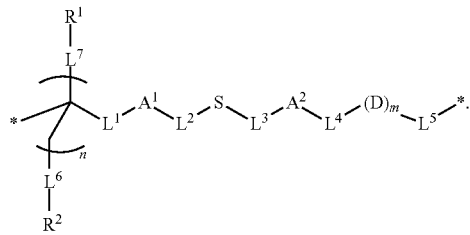

In Chemical Formula 1, $L^1$ to $L^5$ may each independently be a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, $L^6$ and $L^7$ may each independently be O, S, S(O), S($O_2$), C(O), C(O)O, OC(O)O, a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, $R^1$ and $R^2$ may each independently be hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C2 to C20 heterocycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, n may be an integer of 1 to 1,000, D may be O, S, S($O_2$), C(O), or C(O)O, m may be an integer of 0 or 1,

* is a linking point, $A^1$ and $A^2$ may each independently be O, S, S(O), S(O$_2$), C(O), C(O)O, OC(O)O, a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof, and at least one selected from $A^1$ and $A^2$ may be a group represented by Chemical Formula A:

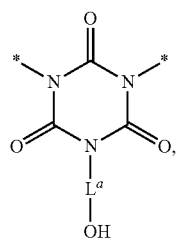

[Chemical Formula A]

wherein, in Chemical Formula A, $L^a$ may be a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, and

* is a linking point.

One or more example embodiments of the present disclosure provide a method of forming patterns including: forming an etching subject layer on a substrate, coating the aforementioned resist underlayer composition on the etching subject layer to form a resist underlayer, forming a photoresist pattern on the resist underlayer, and sequentially etching the resist underlayer and the etching subject layer using the photoresist pattern as an etching mask.

The resist underlayer composition may have improved coating properties, adherence with photoresist, and/or a fast etch rate.

DETAILED DESCRIPTION

Example embodiments of the present disclosure will hereinafter be described in more detail, and may be easily performed by a person skilled in the art. However, this disclosure may be embodied in many different forms and is not construed as limited to the example embodiments set forth herein.

As used herein, when a definition is not otherwise provided, "substituted" refers to replacement of a hydrogen atom of a compound by a substituent selected from a halogen atom (F, Br, Cl, or I), a hydroxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a vinyl group, a C1 to C20 alkyl group, a C2 to C20 alkenyl group, a C2 to C20 alkynyl group, a C6 to C30 aryl group, a C7 to C30 arylalkyl group, a C3 to C30 allyl group, a C1 to C30 alkoxy group, a C1 to C20 heteroalkyl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, and combinations thereof.

As used herein, when a definition is not otherwise provided, "hetero" refers to one (e.g., a group) including 1 to 10 heteroatoms, each independently selected from nitrogen (N), oxygen (O), sulfur (S), and phosphorus (P) (e.g., in addition to carbon atoms).

As used herein, when a definition is not otherwise provided, "*" refers to a linking point of a compound or a compound moiety.

Hereinafter, a resist underlayer composition according to an embodiment is described.

One or more example embodiments of the present disclosure provide a resist underlayer composition including a polymer including a structural unit represented by Chemical Formula 1; and a solvent:

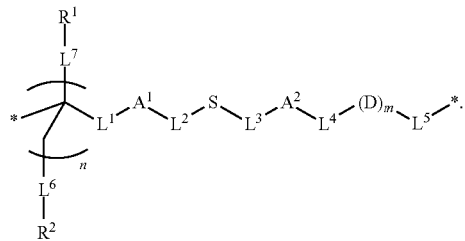

[Chemical Formula 1]

In Chemical Formula 1, $L^1$ to $L^5$ may each independently be a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, $L^6$ and $L^7$ may each independently be O, S, S(O), S(O$_2$), C(O), C(O)O, OC(O)O, a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, $R^1$ and $R^2$ may each independently be hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C2 to C20 heterocycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, n may be an integer of 1 to 1,000, D may be O, S, S(O$_2$), C(O), or C(O)O, m may be an integer of 0 or 1,

* is a linking point, $A^1$ and $A^2$ may each independently be O, S, S(O), S(O$_2$), C(O), C(O)O, OC(O)O, a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof, and at least one of $A^1$ and $A^2$ may be a group represented by Chemical Formula A:

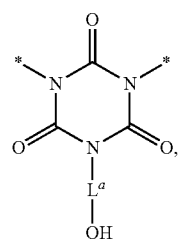

[Chemical Formula A]

wherein, in Chemical Formula A, $L^a$ may be a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, and

* is a linking point.

The polymer may include a main chain and a side chain, and the main chain may include at least one isocyanuric acid moiety having a structure in which a heterocycloalkylene backbone is present in the core, and three oxygens are linked with the heterocycloalkylene. This polymer structure may induce formation of a film having a high density, and may thus accomplish high coating uniformity and improved adherence. In some embodiments, high etch selectivity with a photoresist layer in the etching process and excellent flatness may be obtained.

The isocyanuric acid moiety may be substituted with at least one hydroxy group, and increased coating uniformity may be further secured due to this structure.

In addition, the main chain may be structurally linked with (e.g., may include) at least one sulfur (S) atom. When this structure is included, a faster etch rate may be obtained.

The side chain may be included as a branch shape from the main chain, and the film density may be further increased when the side chain is included to be linked with the main chain, and accordingly, excellent surface characteristics such as improved coating uniformity, adherence, and/or the like may be realized.

In some embodiments, $A^1$ and $A^2$ may each independently be a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof.

For example, $A^1$ and $A^2$ may each independently be one selected from the moieties of Group I:

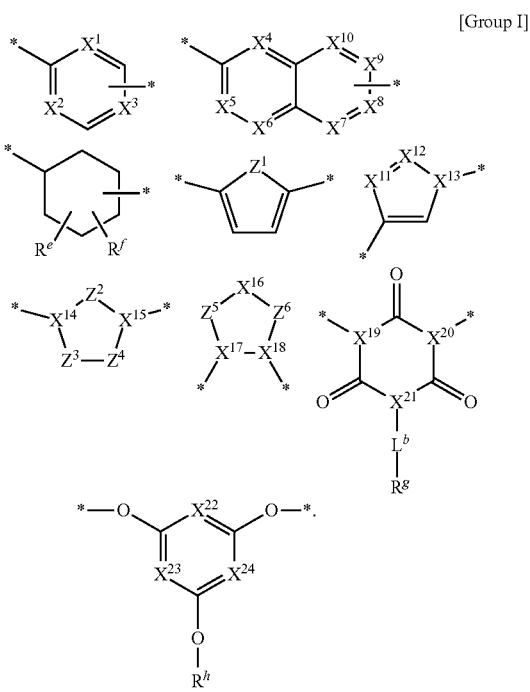

[Group I]

In Group I, $X^1$ to $X^{15}$ and $X^{17}$ to $X^{24}$ may each independently be N or $CR^b$, $X^{16}$ may $NR^a$ or $CR^cR^d$, $Z^1$ to $Z^6$ may each independently be O, S, C(O), or $CR^cR^d$, $R^a$, $R^b$, $R^c$, $R^d$, $R^e$, $R^f$, $R^g$, and $R^h$ may each independently be hydrogen, deuterium, a hydroxy group, a thiol group, a halogen, a substituted or unsubstituted vinyl group, a substituted or unsubstituted C1 to C30 alkyl group, a substituted or unsubstituted C6 to C30 aryl group, a substituted or unsubstituted C1 to C10 alkoxy group, or a combination thereof, $L^b$ may be a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, and

* is a linking point.

In some embodiments, $A^1$ and $A^2$ may each independently be one selected from the moieties of Group I-1:

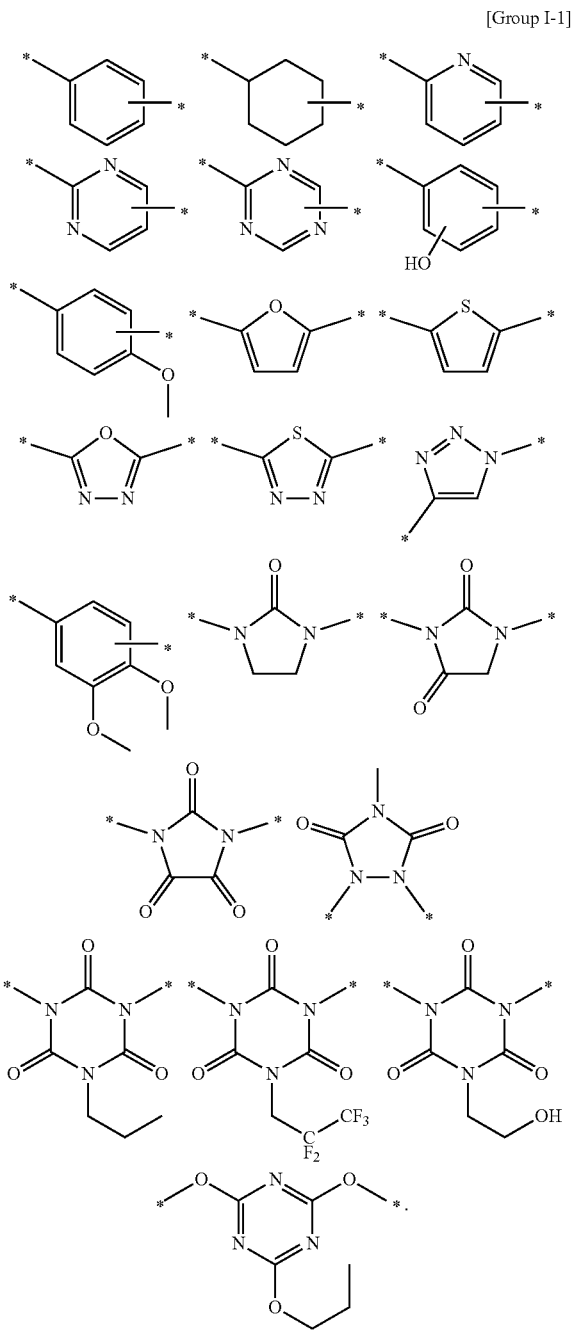

[Group I-1]

In Group I-1, * is a linking point.

In some embodiments, for example, one of $A^1$ and $A^2$ may be a moiety derived from the isocyanuric acid backbone represented by Chemical Formula A, and the other may be a moiety selected from Group I-1.

In some embodiments, one of $A^1$ and $A^2$ may be a moiety derived from the isocyanuric acid backbone and represented by Chemical Formula A, and the other may be a moiety including an isocyanuric acid backbone as selected from the moieties of Group I-1.

For example, the polymer may include at least one of the structural units represented by Chemical Formula 2 to Chemical Formula 5.

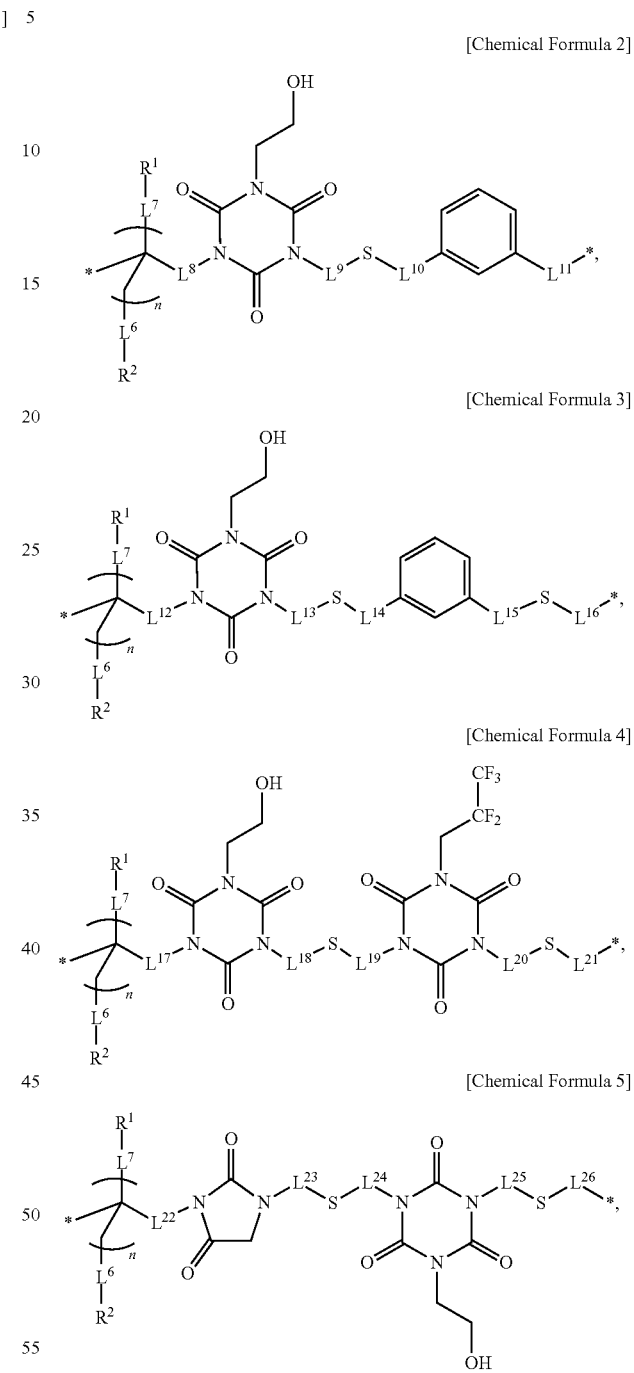

[Chemical Formula 2]

[Chemical Formula 3]

[Chemical Formula 4]

[Chemical Formula 5]

In Chemical Formula 2 to Chemical Formula 5, $R^1$, $R^2$, n, $L^6$, and $L^7$ may each independently be the same as described above, $L^8$ to $L^{26}$ may each independently be a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, and
* is a linking point.

In an example embodiment, the polymer may include at least one of the structural units represented by Chemical Formula 6 to Chemical Formula 8:

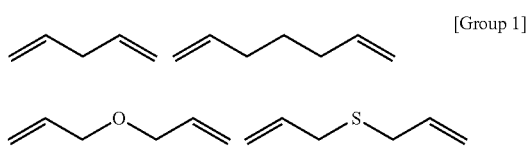

[Group 1]

[Chemical Formula 6]

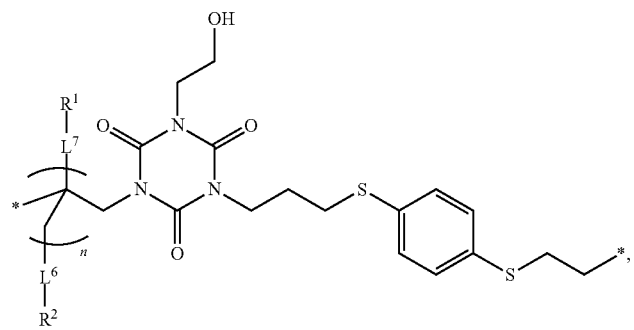

[Chemical Formula 7]

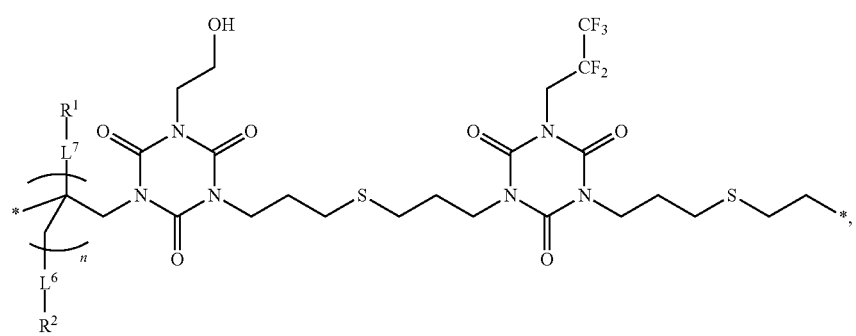

[Chemical Formula 8]

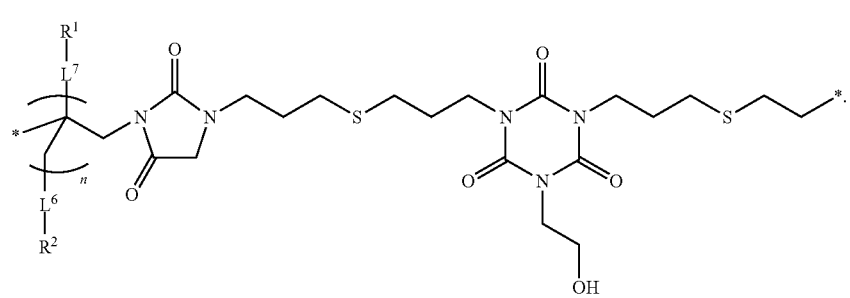

In Chemical Formula 6 to Chemical Formula 8, $R^1$, $R^2$, n, $L^6$, and $L^7$ may each independently be the same as described above, and * is a linking point.

The linking group represented by $L^1$ to $L^{26}$ may be unsubstituted or substituted with at least one selected from a C1 to C5 alkyl group, a halogen group, a hydroxy group (—OH), an amino group (—NH$_2$), a carboxyl group (—COOH), an amide group (—CONH$_2$), and a thiol group (—SH), in place of at least one of the hydrogen atoms constituting the linking group.

For example, the polymer may be obtained through a chemical reaction between a monomolecule (e.g., monomer) including at least one vinyl group, and a monomolecule including at least one thiol group.

The monomolecule including at least one vinyl group may include, for example, structural units of Group 1, but is not limited thereto:

-continued

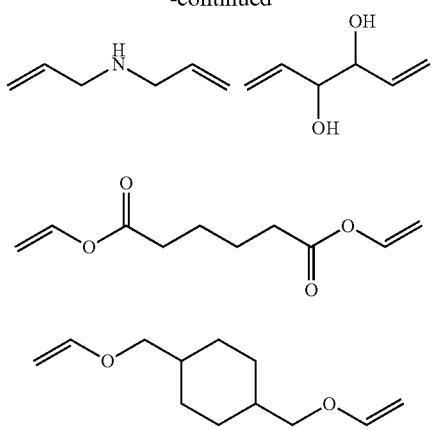

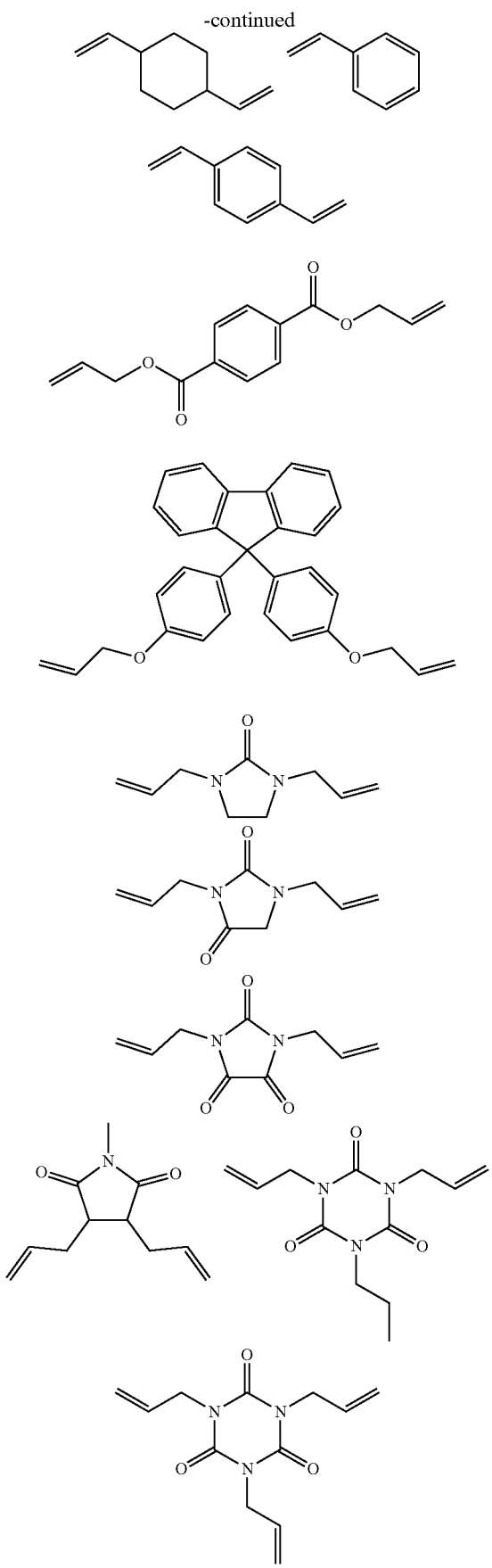
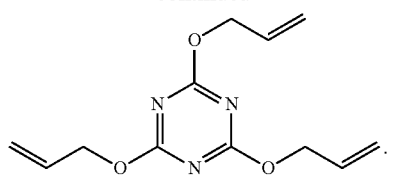
In addition, the monomolecule including at least one thiol group may include, for example, structural units of Group 2, but is not limited thereto:
[Group 2]
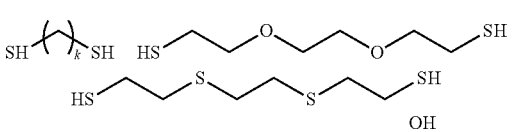
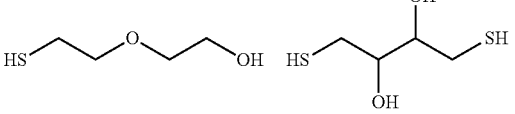
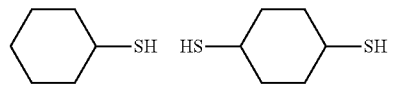
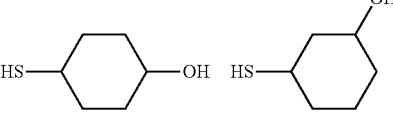
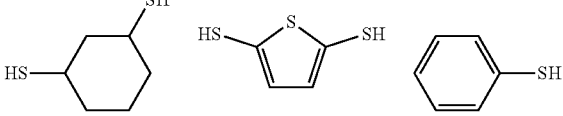
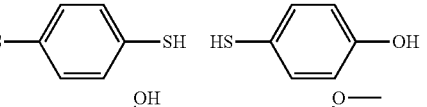
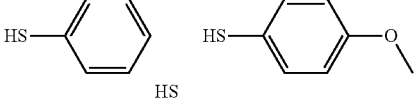
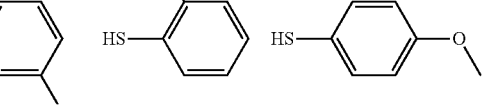
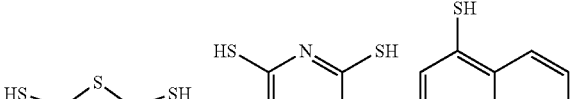
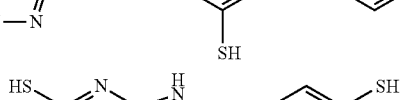
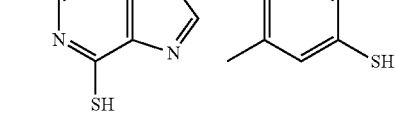

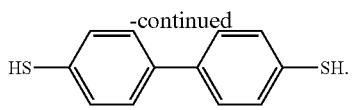

In Group 2, k may be an integer of 1 to 10.

n may be an integer of 1 to 100, and in some embodiments, n may be an integer of 1 to 20.

The polymer may provide a resist underlayer having improved coating uniformity due to its improved solubility. When the polymer is used as a material for forming a resist underlayer, a substantially uniform thin film may not only be formed without a pin-hole, a void, or a deteriorated thickness distribution during the baking process, but excellent gap-fill and planarization characteristics may also be provided when steps are present in a lower substrate or film, or a pattern is formed therein.

The polymer may have a weight average molecular weight of about 1,000 to about 100,000. In some embodiments, the polymer may have a weight average molecular weight of about 1,000 to about 50,000, or about 1,000 to about 20,000. When the polymer has a weight average molecular weight within the above-described ranges, the amount of carbon and the solubility of the resist underlayer composition including the polymer may be optimized or made suitable.

The polymer may be included in an amount of about 0.1 wt % to 50 wt %, about 0.1 wt % to about 30 wt %, or about 0.1 wt % to about 15 wt % based on a total amount of 100 wt % of the resist underlayer composition. Within the above-described ranges, the thickness, surface roughness, and planarization degree of a resist underlayer may be adjusted.

The solvent may be any suitable solvent having sufficient solubility or dispersibility for the polymer, and for example, may include at least one of propylene glycol, propylene glycol diacetate, methoxy propanediol, diethylene glycol, diethylene glycol butylether, tri(ethylene glycol)monomethylether, propylene glycol monomethylether, propylene glycol monomethylether acetate, cyclohexanone, ethyl lactate, gamma-butyrolactone, N,N-dimethyl formamide, N,N-dimethyl acetamide, methyl pyrrolidone (or methyl pyrrolidinone), acetylacetone, or ethyl 3-ethoxypropionate.

The resist underlayer composition may further include at least one other polymer of (e.g., including or based on) an acryl-based resin, an epoxy-based resin, a novolac resin, a glycoluril-based resin, and a melamine-based resin, in addition to the polymer, but is not limited thereto.

The resist underlayer composition may further include at least one additive selected from a surfactant, a thermal acid generator, a plasticizer, and a combination thereof.

The surfactant may include, for example, an alkylbenzene sulfonate salt, an alkyl pyridinium salt, polyethylene glycol, a quaternary ammonium salt, and/or the like, but is not limited thereto.

The thermal acid generator may be, for example, an acidic compound (such as p-toluene sulfonic acid, trifluoromethanesulfonic acid, pyridinium p-toluene sulfonic acid, salicylic acid, sulfosalicylic acid, citric acid, benzoic acid, hydroxybenzoic acid, naphthalene carbonic acid, and/or the like), 2,4,4,6-tetrabromocyclohexadienone, benzoin tosylate, 2-nitrobenzyl tosylate, other organosulfonic acid alkylesters, and/or the like, but is not limited thereto.

The additive may be included in an amount of about 0.001 to 40 parts by weight based on 100 parts by weight of the resist underlayer composition. Within this range, solubility may be improved while the optical properties of the resist underlayer composition are not changed.

One or more example embodiments of the present disclosure provide a resist underlayer manufactured using the aforementioned resist underlayer composition. The resist underlayer may be obtained by coating the resist underlayer composition on (for example) a substrate, and then curing it through a heat treatment process. A temperature of heat-treating the coated resist underlayer composition is about 100° C. to about 500° C. The resist underlayer may be, for example, an organic thin layer used in electronic devices such as a planarization layer, an anti-reflection coating, a sacrificial layer, and/or a filler.

Hereinafter, the present disclosure is described in more detail through examples regarding synthesis of the polymer and preparation of a resist underlayer composition including the same. However, the present disclosure is not restricted by the following examples.

Synthesis of Polymer

Synthesis Example 1

17.7 g of DAC-EC (1,3-diallyl-5-(2-hydroxyethyl) isocyanurate), 2.2 g of benzene-1,4-dithiol, 2.3 g of AIBN (azobisisobutyronitrile), and 15.9 g of N,N-dimethyl formamide (DMF) were put in a 500 mL two-necked round flask, and a condenser was connected thereto. The obtained mixture was reacted at 80° C. for 16 hours, and then cooled down to room temperature. The reaction solution was put in a 1 L wide-mouthed bottle and twice washed with 800 g of water. The obtained resin in a gum state was completely dissolved using 80 g of tetrahydrofuran (THF), and 800 g of toluene was poured thereinto to obtain a precipitate. The solvent was decanted, and a vacuum pump was used to remove the solvent remaining in the resin.

A polymer (Mw=8,500) including the structural unit represented by Chemical Formula 9 was obtained:

[Chemical Formula 9]

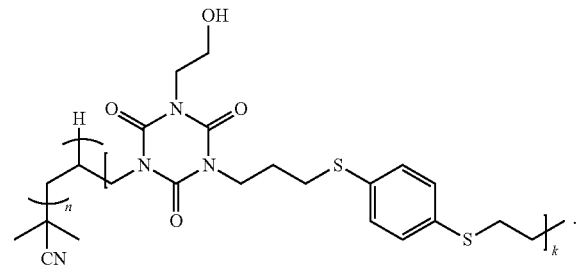

In Chemical Formula 9, n is 10 and k is 8.

Synthesis Example 2

17.7 g of DAC-EC (1,3-diallyl-5-(2-hydroxyethyl) isocyanurate), 1.1 g of 1,3-bis(3-mercaptopropyl)-5-(2,2,3,3,3-fluoropropyl)-1,3,5-triazine-2,4,6(1H,3H,5H)trione, 2.3 g of AIBN (azobisisobutyronitrile), and 15.9 g of N,N-dimethyl formamide (DMF) were put in a 500 mL two-necked round flask, and a condenser was connected thereto. The obtained mixture was reacted at 80° C. for 16 hours, and then cooled down to room temperature. The reaction solution was put in a 1 L wide-mouthed bottle and twice washed with 800 g of water. The obtained resin in a gum state was completely dissolved using 80 g of tetrahydrofuran (THF), and 800 g of toluene was poured thereinto to obtain a precipitate. The solvent was decanted, and a vacuum pump was used to remove the solvent remaining in the resin.

A polymer (Mw=10,500) including the structural unit represented by Chemical Formula 10 was obtained:

temperature. The reaction solution was put in a 1 L wide-mouthed bottle and twice washed with 800 g of water. The obtained resin in a gum state was completely dissolved in 80 g of tetrahydrofuran (THF), and 800 g of toluene was poured thereinto to obtain a precipitate. The solvent was decanted,

[Chemical Formula 10]

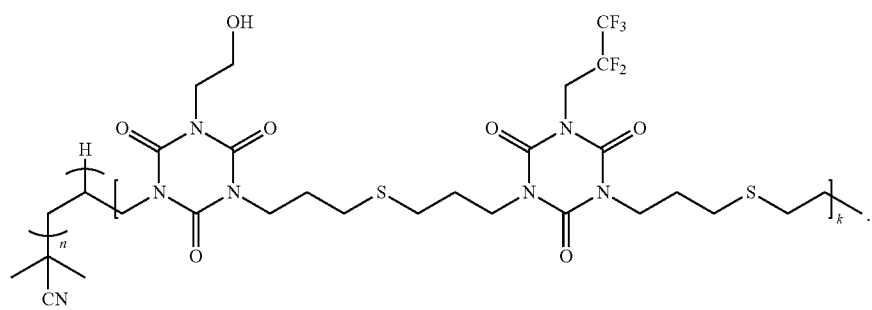

In Chemical Formula 10, n is 8 and k is 5.

Synthesis Example 3

15.4 g of 1,3-di-2-propenyl-2,4-imidazolidinedione, 4.7 g of 1,3-bis(3-mercaptopropyl)-5-(2-hydroxyethyl)-1,3,5-triazine-2,4,6(1H,3H,5H)trione, 2.1 g of AIBN (azobisisobutyronitrile), and 15.9 g of N,N-dimethyl formamide (DMF) were put in a 500 mL two-necked round flask, and a condenser was connected thereto. The obtained mixture was reacted at 80° C. for 16 hours, and then cooled down to room temperature. The reaction solution was put in a 1 L wide-mouthed bottle and twice washed with 800 g of water. The obtained resin in a gum state was completely dissolved in 80 g of tetrahydrofuran (THF), and 800 g of toluene was poured thereinto to obtain a precipitate. The solvent was decanted, and a vacuum pump was used to remove the solvent remaining in the resin.

A polymer (Mw=9,600) including the structural unit represented by Chemical Formula 11 was obtained:

and a vacuum pump was used to remove the solvent remaining in the resin.

A polymer (Mw=5,000) including the structural unit represented by Chemical Formula 12 was obtained:

[Chemical Formula 12]

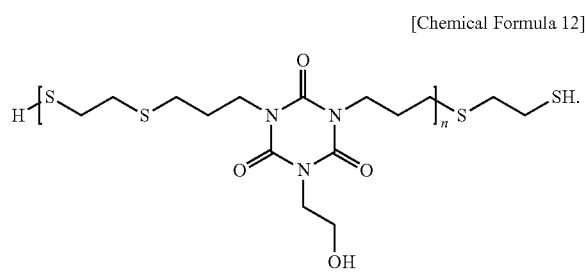

In Chemical Formula 12, n is 12.

[Chemical Formula 11]

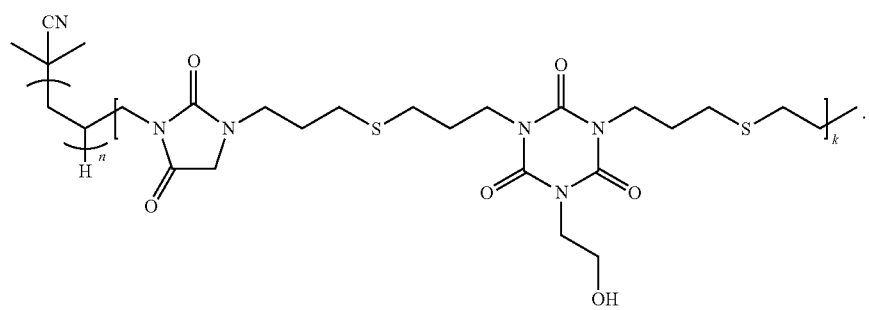

In Chemical Formula 11, n is 11 and k is 6.

Comparative Synthesis Example 1

15.4 g of DAC-EC (1,3-diallyl-5-(2-hydroxyethyl)isocyanurate), 9 g of 1,2-ethane dithiol, 1.8 g of AIBN (azobisisobutyronitrile), and 40 g of N,N-dimethyl formamide (DMF) were put in a 500 mL two-necked round flask, and a condenser was connected thereto. The obtained mixture was reacted at 80° C. for 16 hours and cooled down to room

Comparative Synthesis Example 2

8 g of methyl methacrylate, 10.5 g of 2-hydroxyethyl methacrylate, 1.8 g of AIBN (azobisisobutyronitrile), and 30 g of N,N-dimethyl formamide (DMF) were put in a 500 mL two-necked round flask, and a condenser was connected thereto. The obtained mixture was reacted at 80° C. for 16 hours, and the reaction solution was cooled down to room temperature. The reaction solution was put in a 1 L wide-mouthed bottle and twice washed with 800 g of water. The obtained resin in a gum state was completely dissolved in 80 g of tetrahydrofuran (THF), and 800 g of toluene was poured thereinto to obtain a precipitate. The solvent was decanted, and a vacuum pump was used to remove the solvent remaining in the resin.

A polymer (Mw=6,000) including the structural unit represented by Chemical Formula 13 was obtained:

[Chemical Formula 13]

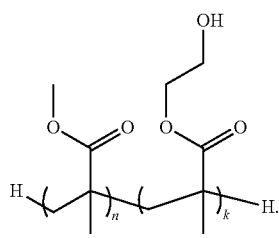

In Chemical Formula 13, n is 8 and k is 8.

Preparation of Resist Underlayer Composition

Example 1

A resist underlayer composition was prepared by dissolving 10 parts by weight of PD1174 (manufactured by TCI; a hardener) and 0.6 parts by weight of pyridinium p-toluene sulfonate based on 100 parts by weight of the polymer of Synthesis Example 1 in a mixed solvent of propylene glycol monomethylether and propylene glycol monomethylether acetate (mixing weight ratio=1:1), and then stirring the solution for 6 hours.

The mixed solvent was used in an amount of 2 wt % based on a total amount of the resist underlayer composition including the polymer solid content.

Example 2 and Example 3

The resist underlayer compositions of Examples 2 and 3 were each prepared according to substantially the same method as in Example 1, except that the polymers of Synthesis Examples 2 and 3 were respectively used.

Comparative Examples 1 and 2

The resist underlayer compositions of Comparative Examples 1 and 2 were each prepared according to substantially the same method as in Example 1, except that the polymers of Comparative Synthesis Examples 1 and 2 were respectively used.

Evaluation 1: Coating Uniformity 2 mL volumes of the compositions of Examples 1 to 3 and Comparative Examples 1 to 2 were respectively coated on an 8 inch wafer, spin-coated at 1,500 rpm for 20 seconds using an auto track (ACT-8, Tokyo Electron Limited (TEL)), and cured at 230° C. for 90 seconds to form thin films, each having a thickness of about 5 nm. The thicknesses of the films were measured at 51 points in a vertical direction in order to compare the uniformities of each film.

The results are shown in Table 1.

In Table 1, a small numerical value indicates better coating uniformity (%).

TABLE 1

|  | Coating uniformity (%) |
|---|---|
| Example 1 | 5.2 |
| Example 2 | 7.6 |
| Example 3 | 7.7 |
| Comparative Example 1 | 9.2 |
| Comparative Example 2 | 10.5 |

Referring to Table 1, the resist underlayer compositions of Examples 1 to 3 exhibited excellent coating uniformity compared with the resist underlayer compositions of Comparative Examples 1 and 2.

Evaluation 2: Contact Angle 2 mL volumes of the compositions of Examples 1 to 3 and Comparative Examples 1 and 2 were respectively spin-coated on an 8 inch wafer at 1,500 rpm for 20 seconds using a spin coater (Mikasa Co., Ltd.). Subsequently, the coated compositions were cured at 210° C. for 90 second to form thin films, and distilled deionized water (DIW) was dropped on the surface thereof to measure an contact angle. The measured contact angles are shown in Table 2.

When the contact angles are larger (relatively large), excellent adherence to a resist is obtained.

TABLE 2

|  | Contact angle (°) |
|---|---|
| Example 1 | 65 |
| Example 2 | 64 |
| Example 3 | 61 |
| Comparative Example 1 | 60 |
| Comparative Example 2 | 52 |

Evaluation 3: Dry Etch Test 2 mL volumes of the compositions of Examples 1 to 3 and Comparative Examples 1 and 2 were respectively spin-coated on a 12 inch wafer at 1,500 rpm for 20 seconds using an SVS-MX3000 auto track. Subsequently, the coated compositions were cured at 205° C. for 60 seconds to form resist underlayers. The resist underlayers were respectively etched under $CF_4$, $CHF_3$, and $O_2$ gas for 20 seconds, the etched thicknesses were measured to calculate etch rates, and the results are shown in Table 3.

In Table 3, the etch rate results were obtained as a relative ratio by setting the etch rate of Comparative Example 2 as a reference (1.0) and calculating the etch rates of the Examples relative to Comparative Example 2.

TABLE 3

|  | Etch rate |
|---|---|
| Example 1 | 1.42 |
| Example 2 | 1.55 |
| Example 3 | 1.52 |
| Comparative Example 1 | 1.44 |
| Comparative Example 2 | 1.0 |

While this disclosure has been described in connection with what is presently considered to be practical example embodiments, it is to be understood that the disclosure is not limited to the disclosed embodiments. On the contrary, it is intended to cover various modifications and equivalent arrangements included within the spirit and scope of the appended claims and equivalents thereof.

What is claimed is:

1. A resist underlayer composition, comprising:
a polymer including a structural unit represented by Chemical Formula 1; and
a solvent:

[Chemical Formula 1]

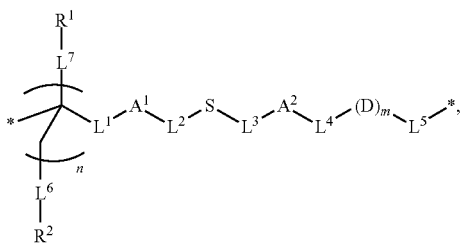

wherein, in Chemical Formula 1, $L^1$ to $L^5$ are each independently a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, $L^6$ and $L^7$ are each independently O, S, S(O), S(O$_2$), C(O), C(O)O, OC(O)O, a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, $R^1$ and $R^2$ are each independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C2 to C20 heterocycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, n is an integer of 1 to 1,000,
D is O, S, S(O$_2$), C(O), or C(O)O,
m is an integer of 0 or 1,
* is a linking point, $A^1$ and $A^2$ are each independently O, S, S(O), S(O$_2$), C(O), C(O)O, OC(O)O, a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or a combination thereof, and at least one of $A^1$ and $A^2$ is a group represented by Chemical Formula A:

[Chemical Formula A]

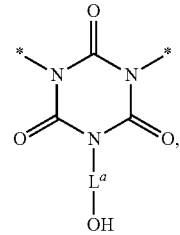

wherein, in Chemical Formula A, $L^a$ is a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, and

* is a linking point.

2. The resist underlayer composition of claim 1, wherein $A^1$ and $A^2$ are each independently a substituted or unsubstituted C3 to C10 cycloalkylene group, a substituted or unsubstituted C2 to C10 heterocycloalkylene group, a substituted or unsubstituted C6 to C30 arylene group, a substituted or unsubstituted C2 to C30 heteroarylene group, or combination thereof.

3. The resist underlayer composition of claim 2, wherein $A^1$ and $A^2$ are each independently one selected from the moieties of Group I:

[Group I]

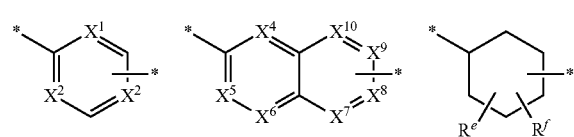

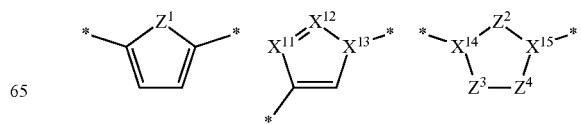

-continued

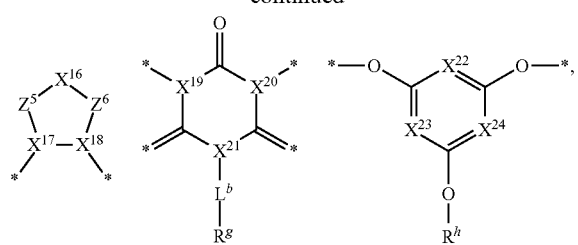

wherein, in Group I, $X^1$ to $X^{15}$ and $X^{17}$ to $X^{24}$ are each independently N or $CR^b$, $X^{16}$ is $NR^a$ or $CR^cR^d$, $Z^1$ to $Z^6$ are each independently O, S, C(O), or $CR^cR^d$, $R^a$, $R^b$, $R^c$, $R^d$, $R^e$, $R^f$, $R^g$, and $R^h$ are each independently hydrogen, deuterium, a hydroxy group, a thiol group, a halogen, a substituted or unsubstituted vinyl group, a substituted or unsubstituted C1 to C30 alkyl group, a substituted or unsubstituted C6 to C30 aryl group, a substituted or unsubstituted C1 to C10 alkoxy group, or a combination thereof, $L^b$ is a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, and

* is a linking point.

4. The resist underlayer composition of claim 3, wherein $A^1$ and $A^2$ are each independently one selected from the moieties of Group I-1:

[Group I-1]

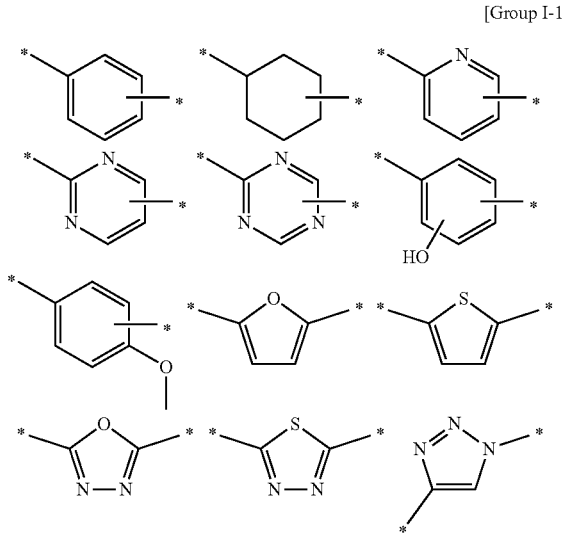

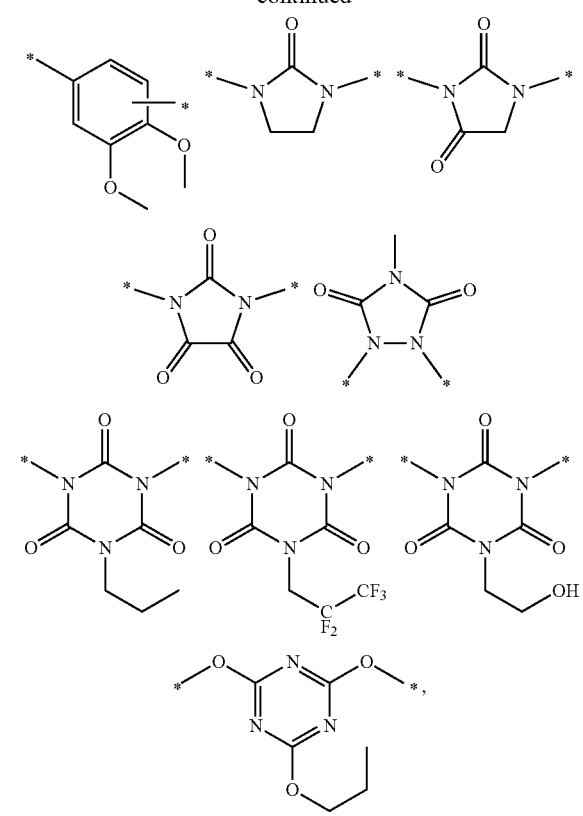

wherein, in Group I-1, * is a linking point.

5. The resist underlayer composition of claim 1, wherein the polymer comprises at least one of the structural units represented by Chemical Formula 2 to Chemical Formula 5:

[Chemical Formula 2]

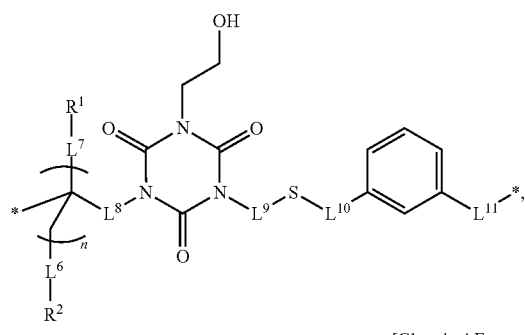

[Chemical Formula 3]

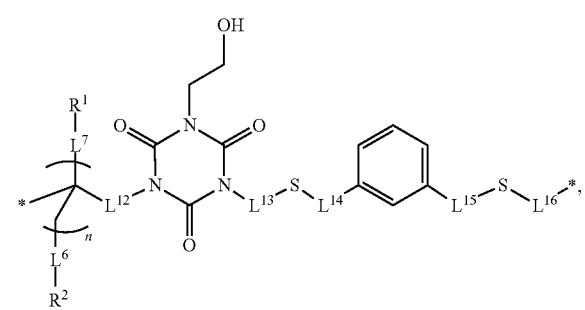

-continued

[Chemical Formula 4]

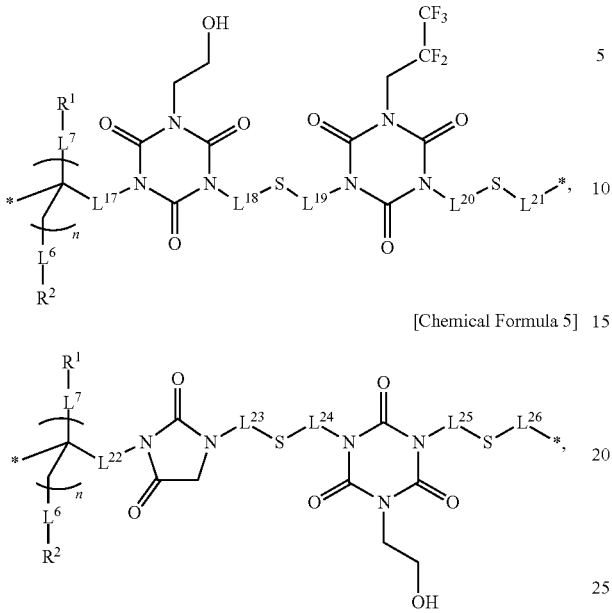

[Chemical Formula 5]

wherein, in Chemical Formula 2 to Chemical Formula 5,
R$^1$ and R$^2$ are each independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C2 to C20 heterocycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, n is an integer of 1 to 1,000, L$^6$ and L$^7$ are each independently O, S, S(O), S(O$_2$), C(O), C(O)O, OC(O)O, a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, L$^8$ to L$^{26}$ are each independently a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, and

* is a linking point.

6. The resist underlayer composition of claim 1, wherein the polymer comprises at least one of the structural units represented by Chemical Formula 6 to Chemical Formula 8:

[Chemical Formula 6]

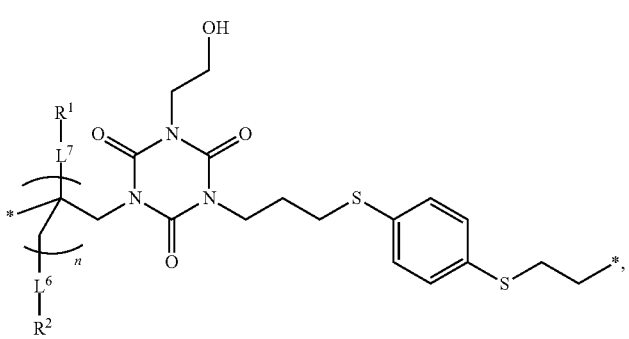

[Chemical Formula 7]

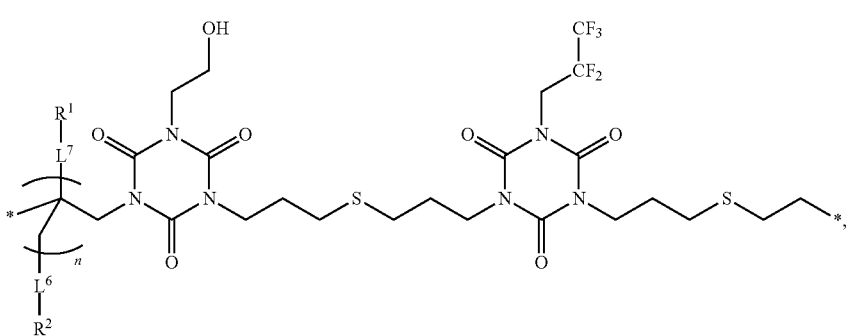

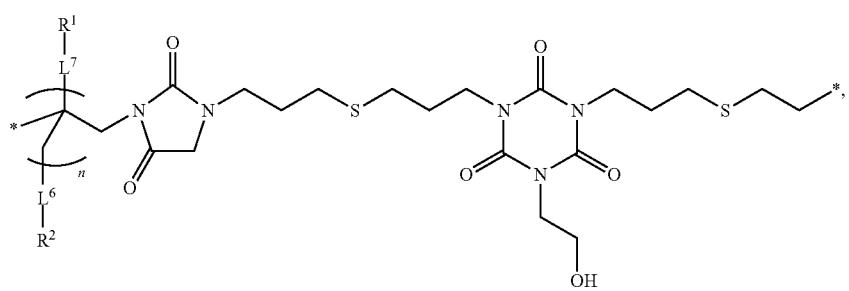

wherein, in Chemical Formula 6 to Chemical Formula 8,
R¹ and R² are each independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C2 to C20 heterocycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, n is an integer of 1 to 1,000, L⁶ and L⁷ are each independently O, S, S(O), S(O₂), C(O), C(O)O, OC(O)O, a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, and

* is a linking point.

7. The resist underlayer composition of claim 1, wherein the polymer has a weight average molecular weight of about 1,000 to about 100,000.

8. The resist underlayer composition of claim 1, wherein the polymer is included in an amount of about 0.1 wt % to about 50 wt % based on a total amount of 100 wt % of the resist underlayer composition.

9. The resist underlayer composition of claim 1, wherein the resist underlayer composition further comprises at least one other polymer selected from an acryl-based resin, an epoxy-based resin, a novolac resin, a glycoluril-based resin, and a melamine-based resin.

10. The resist underlayer composition of claim 1, wherein the resist underlayer composition further comprises at least one additive selected from a surfactant, a thermal acid generator, a plasticizer, and a combination thereof.

11. A method of forming patterns, the method comprising:
forming an etching subject layer on a substrate;
coating the resist underlayer composition of claim 1 on the etching subject layer to form a resist underlayer;
forming a photoresist pattern on the resist underlayer; and
sequentially etching the resist underlayer and the etching subject layer using the photoresist pattern as an etching mask.

12. The method of claim 11, wherein the forming of the photoresist pattern comprises:
forming a photoresist layer on the resist underlayer;
exposing the photoresist layer; and
developing the photoresist layer.

13. The method of claim 11, wherein the forming of the resist underlayer further comprises heat-treating the coated resist underlayer composition at a temperature of about 100° C. to about 500° C.

14. The method of claim 11, wherein the polymer comprises at least one of the structural units represented by Chemical Formula 2 to Chemical Formula 5:

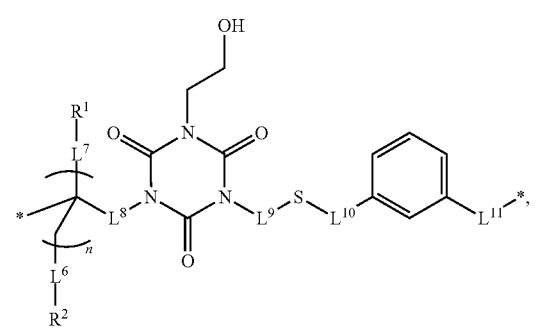

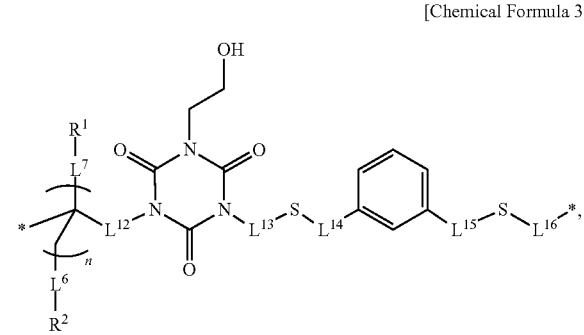

[Chemical Formula 4]

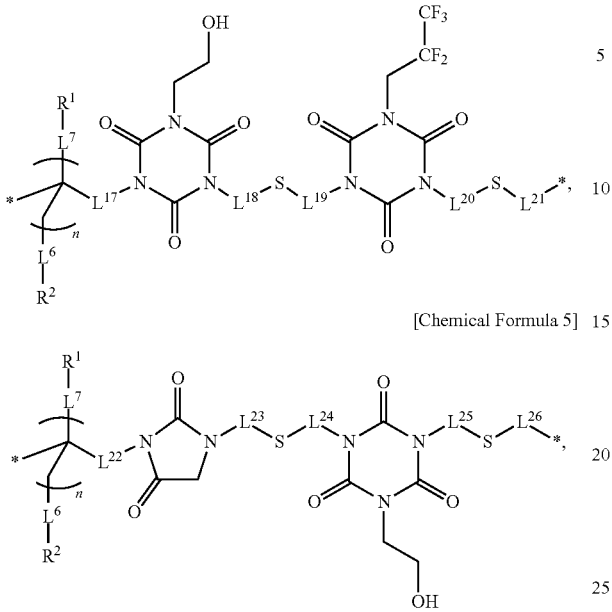

[Chemical Formula 5]

wherein, in Chemical Formula 2 to Chemical Formula 5,

R$^1$ and R$^2$ are each independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C2 to C20 heterocycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, n is an integer of 1 to 1,000, L$^6$ and L$^7$ are each independently O, S, S(O), S(O$_2$), C(O), C(O)O, OC(O)O, a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, L$^8$ to L$^{26}$ are each independently a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, and

* is a linking point.

15. The method of claim 11, wherein the polymer comprises at least one of the structural units represented by Chemical Formula 6 to Chemical Formula 8:

[Chemical Formula 6]

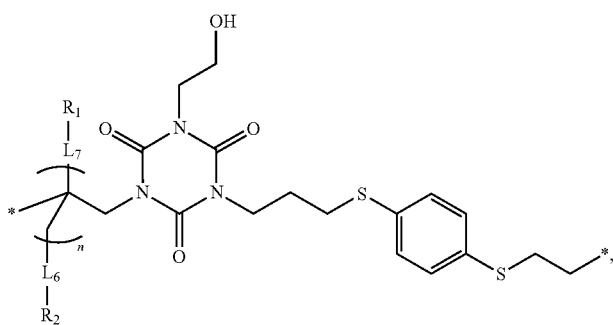

[Chemical Formula 7]

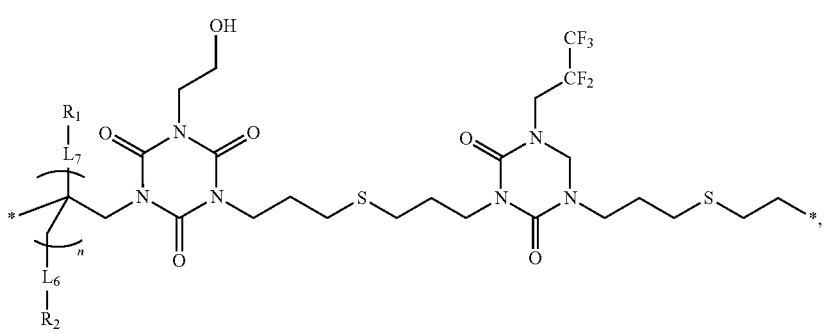

-continued

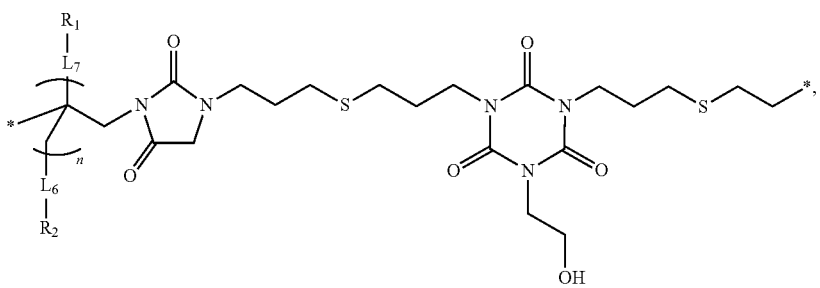

[Chemical Formula 8]

wherein, in Chemical Formula 6 to Chemical Formula 8,
$R^1$ and $R^2$ are each independently hydrogen, deuterium, a halogen, a hydroxy group, a cyano group, a nitro group, an amino group, an epoxy group, a vinyl group, a (meth)acrylate group, an oxetane group, a thiol group, a carboxyl group, a substituted or unsubstituted C1 to C30 alkyl group, a substituted or unsubstituted C2 to C30 alkenyl group, a substituted or unsubstituted C2 to C30 alkynyl group, a substituted or unsubstituted C1 to C10 alkoxy group, a substituted or unsubstituted C1 to C30 thioalkyl group, a substituted or unsubstituted C3 to C30 cycloalkyl group, a substituted or unsubstituted C2 to C20 heterocycloalkyl group, a substituted or unsubstituted C6 to C30 aryl group, a substituted or unsubstituted C6 to C30 aryloxy group, a substituted or unsubstituted C6 to C30 thioaryl group, a substituted or unsubstituted C2 to C30 heteroaryl group, or a combination thereof, n is an integer of 1 to 1,000, $L^6$ and $L^7$ are each independently O, S, S(O), S(O$_2$), C(O), C(O)O, OC(O)O, a single bond, a substituted or unsubstituted C1 to C30 alkylene group, a substituted or unsubstituted C6 to C30 arylene group, a substituted or unsubstituted C1 to C30 heteroalkylene group, a substituted or unsubstituted C3 to C20 cycloalkylene group, a substituted or unsubstituted C2 to C20 heterocycloalkylene group, a substituted or unsubstituted C1 to C30 heteroalkenylene group, a substituted or unsubstituted C2 to C30 heteroarylene group, a substituted or unsubstituted C1 to C30 alkenylene group, a substituted or unsubstituted C1 to C30 alkynylene group, or a combination thereof, and

* is a linking point.

16. The method of claim 11, wherein the polymer has a weight average molecular weight of about 1,000 to about 100,000.

17. The method of claim 11, wherein the polymer is included in an amount of about 0.1 wt % to about 50 wt % based on a total amount of 100 wt % of the resist underlayer composition.

18. The method of claim 11, wherein the resist underlayer composition further comprises at least one other polymer selected from an acryl-based resin, an epoxy-based resin, a novolac resin, a glycoluril-based resin, and a melamine-based resin.

19. The method of claim 11, wherein the resist underlayer composition further comprises at least one additive selected from a surfactant, a thermal acid generator, a plasticizer, and a combination thereof.

* * * * *

UNITED STATES PATENT AND TRADEMARK OFFICE
CERTIFICATE OF CORRECTION

PATENT NO. : 11,249,396 B2  
APPLICATION NO. : 16/789233  
DATED : February 15, 2022  
INVENTOR(S) : Hyeon Park et al.

Page 1 of 3

It is certified that error appears in the above-identified patent and that said Letters Patent is hereby corrected as shown below:

In the Claims

Column 21, approx. Lines 2-10, Claim 3, Group 1:

Delete " 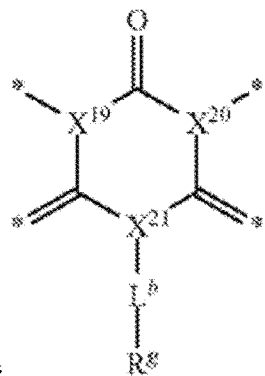 "

Insert -- 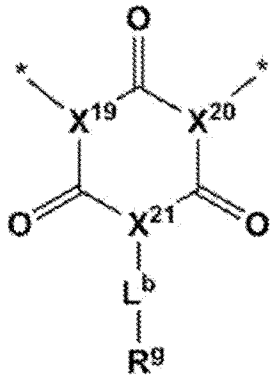 --

Signed and Sealed this  
Thirteenth Day of June, 2023

Katherine Kelly Vidal  
*Director of the United States Patent and Trademark Office*

CERTIFICATE OF CORRECTION (continued)
U.S. Pat. No. 11,249,396 B2

Columns 27-28, approx. Line 42-53, Chemical Formula 6, Claim 14:

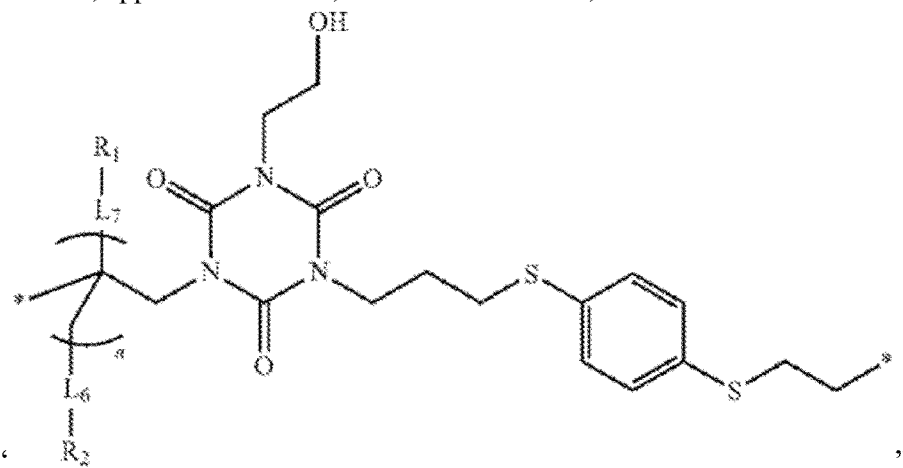

Delete " "

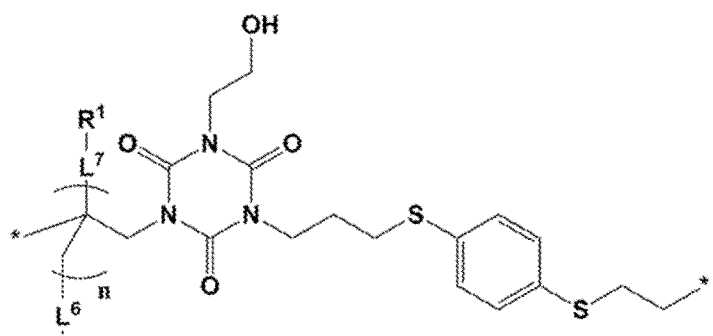

Insert -- --

Columns 27-28, approx. Lines 55-65, Chemical Formula 7, Claim 15:

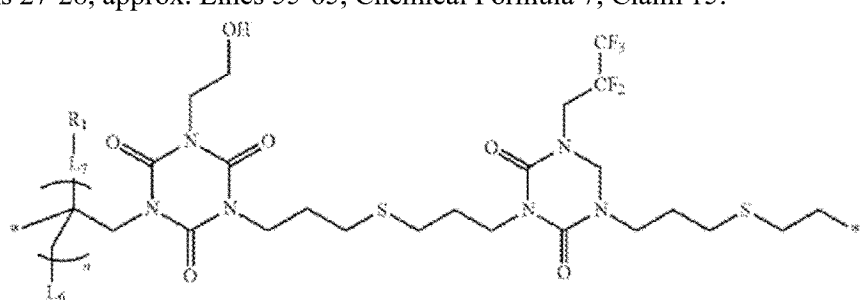

Delete " "

CERTIFICATE OF CORRECTION (continued)
U.S. Pat. No. 11,249,396 B2

Page 3 of 3

Insert -- 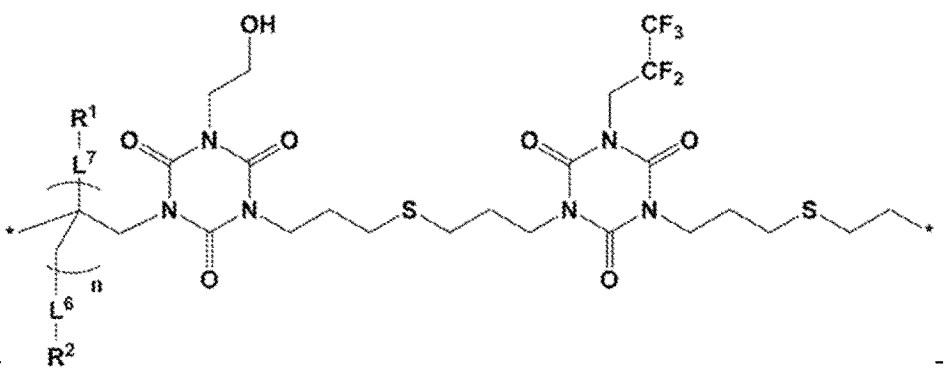 --

Columns 29-30, approx. Lines 2-13, Chemical Formula 8, Claim 15:

Delete " 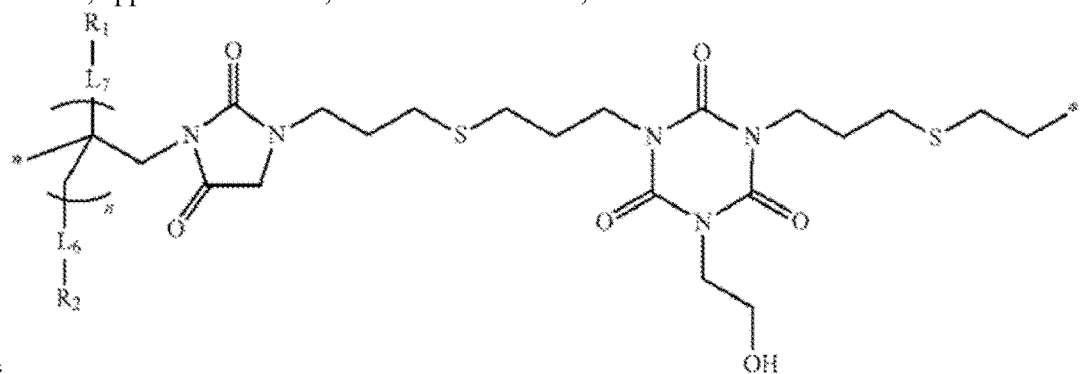 "

Insert -- 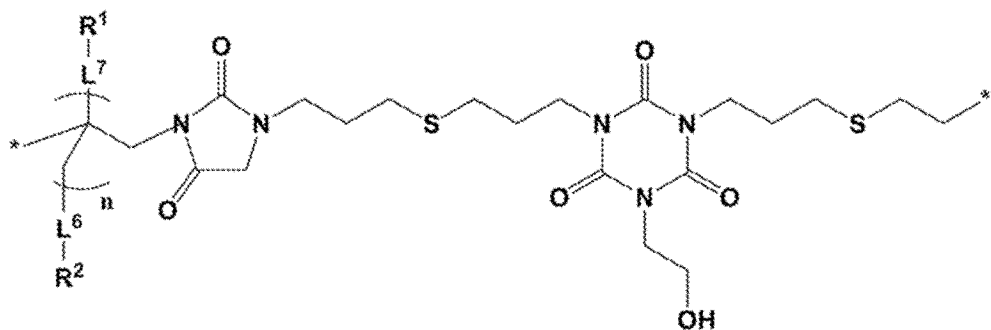 --